(12) United States Patent
Kang et al.

(10) Patent No.: US 10,008,366 B2
(45) Date of Patent: Jun. 26, 2018

(54) SEASONING PROCESS FOR ESTABLISHING A STABLE PROCESS AND EXTENDING CHAMBER UPTIME FOR SEMICONDUCTOR CHIP PROCESSING

(71) Applicant: Applied Materials, Inc., Santa Clara, CA (US)

(72) Inventors: Sang Won Kang, San Jose, CA (US); Nicholas Celeste, Oakland, CA (US); Dmitry Lubomirsky, Cupertino, CA (US); Peter Hillman, San Jose, CA (US); Douglas Brenton Hayden, San Jose, CA (US); Dongqing Yang, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days. days.

(21) Appl. No.: 15/259,401

(22) Filed: Sep. 8, 2016

(65) Prior Publication Data
US 2017/0069463 A1   Mar. 9, 2017

Related U.S. Application Data

(60) Provisional application No. 62/215,590, filed on Sep. 8, 2015.

(51) Int. Cl.
*H01L 21/302* (2006.01)
*H01L 21/461* (2006.01)
*H01J 37/32* (2006.01)

(52) U.S. Cl.
CPC .... *H01J 37/3244* (2013.01); *H01J 37/32357* (2013.01); *H01J 37/32449* (2013.01); *H01J 37/32522* (2013.01); *H01J 37/32724* (2013.01); *H01J 37/32862* (2013.01)

(58) Field of Classification Search
USPC ......................................................... 438/706
See application file for complete search history.

(56) References Cited

U.S. PATENT DOCUMENTS

| | | | |
|---|---|---|---|
| 7,396,480 B2* | 7/2008 | Kao | H01J 37/32082 216/58 |
| 7,520,957 B2 | 4/2009 | Kao et al. | |
| 7,550,381 B2 | 6/2009 | Lu et al. | |
| 7,780,793 B2 | 8/2010 | Yang et al. | |
| 2005/0221552 A1 | 10/2005 | Kao et al. | |
| 2005/0230350 A1 | 10/2005 | Kao et al. | |
| 2006/0051966 A1 | 3/2006 | Or et al. | |
| 2006/0130971 A1 | 6/2006 | Chang et al. | |
| 2007/0123051 A1 | 5/2007 | Arghavani et al. | |
| 2009/0191703 A1 | 7/2009 | Lu et al. | |

* cited by examiner

*Primary Examiner* — Roberts Culbert
(74) *Attorney, Agent, or Firm* — Patterson + Sheridan LLP (57) ABSTRACT

Embodiments of the present disclosure generally provide improved methods for processing substrates with improved process stability, increased mean wafers between clean, and/or improved within wafer uniformity. One embodiment provides a method for seasoning one or more chamber components in a process chamber. The method includes placing a dummy substrate in the process chamber, flowing a processing gas mixture to the process chamber to react with the dummy substrate and generate a byproduct on the dummy substrate, and annealing the dummy substrate to sublimate the byproduct while at least one purge conduit of the process chamber is closed.

18 Claims, 7 Drawing Sheets

SEASONING PROCESS FOR ESTABLISHING A STABLE PROCESS AND EXTENDING CHAMBER UPTIME FOR SEMICONDUCTOR CHIP PROCESSING

CROSS-REFERENCE TO RELATED APPLICATIONS

This application claims priority to U.S. Provisional Patent Application Ser. No. 62/215,590, filed on Sep. 8, 2015, which herein is incorporated by reference.

BACKGROUND

Field

Embodiment of the present disclosure relate to semiconductor processing. More specifically, embodiment of the present disclosure relate to methods for seasoning one or more components of a processing chamber to improve process stability and reduce periodic chamber maintenance.

Description of the Related Art

Selective etching of silicon oxide or silicon nitride over silicon has been widely used in semiconductor foundries including Logic, Flash and DRAM of 28 nm and beyond. The selective etching may be of a smaller etch amount, e.g. 20 Å, or a larger etch amount, e.g. 600 A.

There is constant demand for improved Mean Wafers Between chamber Clean (MWBC) and improved etch amount stability for high volume production. As the scale of the semiconductor, for example, in the process of shallow trench isolation (STI) in the recent development of 10 nm Fin field effect transistor (FinFET), the variation on etch rates at the edge region causes non-uniformity within a wafer which triggers chamber periodic maintenance (PM) and reduces MWBC.

Therefore, there is a need for methods and apparatus for improved process stability, increased mean wafers between clean, and/or improved within wafer uniformity.

SUMMARY

Embodiments of the present disclosure generally provide improved methods for processing substrates with improved process stability, increased mean wafers between clean, and/or improved within wafer uniformity.

One embodiment provides a method for seasoning one or more chamber components in a process chamber. The method includes placing a dummy substrate in the process chamber, flowing a processing gas mixture to the process chamber to react with the dummy substrate and generate a byproduct on the dummy substrate, and annealing the dummy substrate to sublimate the byproduct while at least one purge conduit of the process chamber is closed.

Another embodiment provides a method for processing one or more substrates in a process chamber. The method includes placing a dummy substrate in the process chamber, flowing a processing gas mixture to the process chamber to react with the dummy substrate and generate a byproduct on the dummy substrate, and annealing the dummy substrate to sublimate the byproduct while closing at least one purge conduit of the process chamber; removing the dummy substrate, placing a substrate to be processed in the process chamber, flowing the processing gas mixture to the process chamber to react with the substrate and generate the byproduct on the substrate, and annealing the substrate to sublimate the byproduct from the substrate while purging through the at least one purge conduit of the process chamber.

Another embodiment provides a process chamber. The chamber includes a support member having a seal band, wherein the seal band has an upper surface for contacting a backside of a substrate being processed, an edge ring disposed around the support member to cover an edge region of the support member, wherein a purge conduit is formed between the support member and the edge ring, and a seasoning film formed on at least one of the seal band and the edge ring. The seasoning film is formed by placing a dummy substrates on the support member, flowing a processing gas mixture to the process chamber to react with the dummy substrate and generate a byproduct on the dummy substrate, and annealing the dummy substrate to sublimate the byproduct while closing the purge conduit.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures. It is contemplated that elements disclosed in one implementation may be beneficially utilized on other implementations without specific recitation.

DETAILED DESCRIPTION

Embodiments of the present disclosure generally provide improved methods for processing substrates with improved process stability, increased mean wafers between clean, and/or improved within wafer uniformity. A seasoning process has been described for establishing a stable process rate, such as etch rate, over thousands of substrates and/or for extending chamber uptime after periodical maintenance. In one embodiment, the seasoning process includes fluorinating brand new or newly cleaned hardware and forming a uniform by-product on the hardware. In one embodiment, the hardware may be a support member (also known as a chiller plate) to provide consistent and uniform contact between the substrate being processed and the support member. In another embodiment, the hardware may be an edge ring covering an edge region of the support member.

In one embodiment, the seasoning process is similar to the process to be performed. In one embodiment, the seasoning process may be applied to process chambers configured to perform SICONI® process. During SICONI® process, combination of NH3/H2/NF3 may be introduced into a remote plasma source to generate etchants such as NH4F, NH4FHF and HF. The etchants are then introduced to a process chamber to react with SiO2 and Si3N4 to form (NH4)2SiF6, a solid byproduct. The solid byproduct is then sublimated above 100° C. to leave a smooth surface on one or more chamber components. The smooth surface may be formed by a film of silicon oxide or silicon nitride.

Figure 1A:
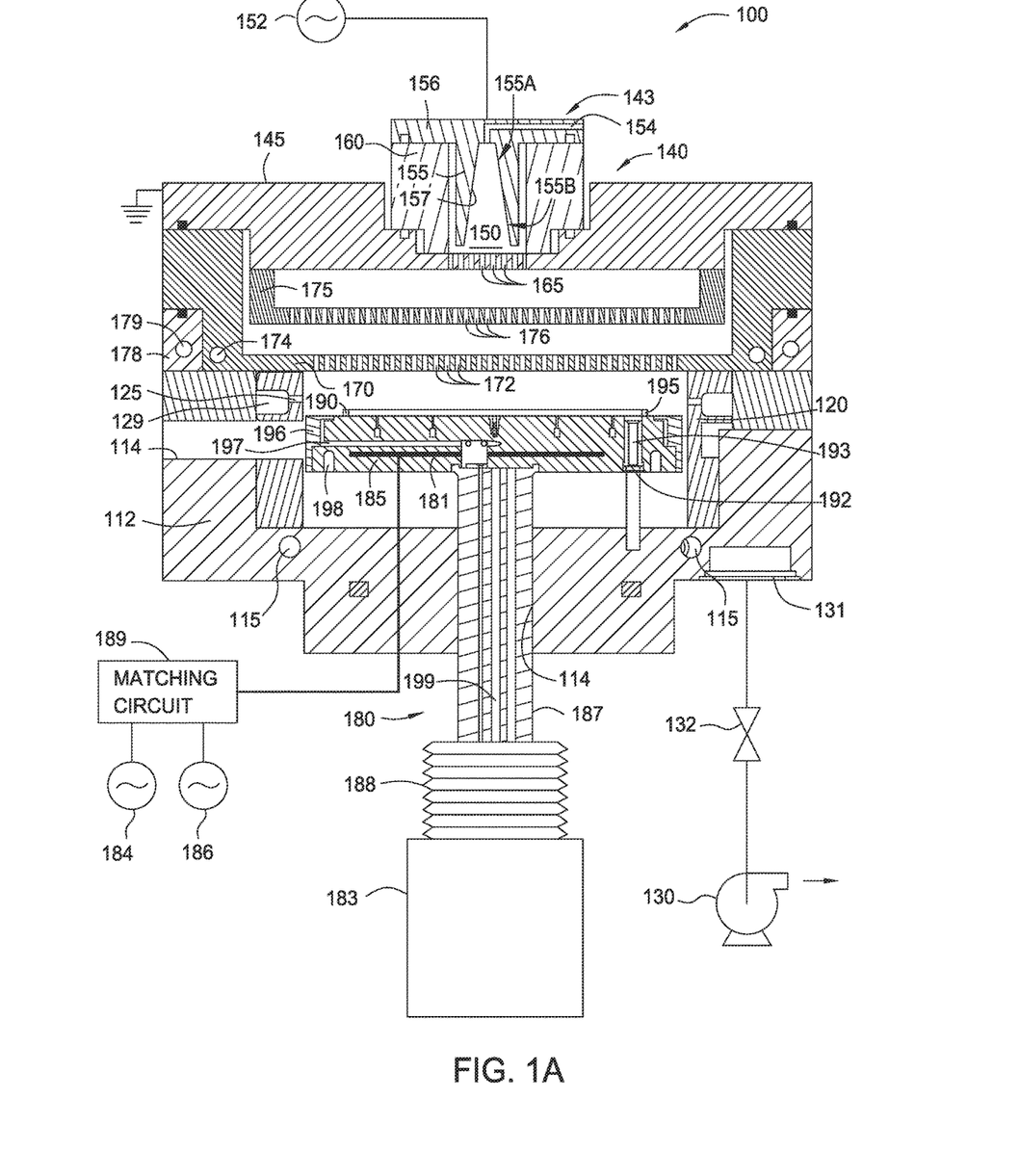
FIG. 1A is a schematic cross-sectional view of an exemplary processing chamber according to one embodiment of the present disclosure.

FIG. 1A is a schematic cross sectional view of a process chamber 100 according to one embodiment of the present disclosure. The process chamber 100 is configured to remove materials from a material layer disposed on a substrate surface. The process chamber 100 is particularly useful for performing the plasma assisted dry etch process.

The process chamber 100 provides both heating and cooling of a substrate surface without breaking vacuum. In one embodiment, the process chamber 100 includes a chamber body 112, a lid assembly 140, and a support assembly 180. The lid assembly 140 is disposed at an upper end of the chamber body 112, and the support assembly 180 is at least partially disposed within the chamber body 112.

The chamber body 112 includes a slit valve opening 114 formed in a sidewall thereof to provide access to an interior of the process chamber 100. The slit valve opening 114 is selectively opened and closed to allow access to the interior of the chamber body 112 by a wafer handling robot (not shown).

In one or more embodiments, the chamber body 112 includes a channel 115 formed therein for flowing a heat transfer fluid therethrough. The heat transfer fluid can be a heating fluid or a coolant and is used to control the temperature of the chamber body 112 during processing. Control of the temperature of the chamber body 112 is useful to prevent unwanted condensation of the gas or byproducts on the interior of the chamber body 112. Exemplary heat transfer fluids include water, ethylene glycol, or a mixture thereof. An exemplary heat transfer fluid may also include nitrogen gas.

The chamber body 112 may further include a liner 120 that surrounds the support assembly 180. The liner 120 is removable for servicing and cleaning. The liner 120 can be made of a metal such as aluminum, a ceramic material, or any other process compatible material. The liner 120 can be bead blasted to increase surface roughness and/or surface area which increases the adhesion of any material deposited thereon, thereby preventing flaking of material which results in contamination of the process chamber 100. In one or more embodiments, the liner 120 includes one or more apertures 125 and a pumping channel 129 formed therein that is in fluid communication with a vacuum port 131. The apertures 125 provide a flow path for gases into the pumping channel 129, which provides an egress for the gases within the process chamber 100 to the vacuum port 131.

A vacuum system is coupled to the vacuum port 131. The vacuum system may include a vacuum pump 130 and a throttle valve 132 to regulate flow of gases through the process chamber 100. The vacuum pump 130 is coupled to a vacuum port 131 disposed in the chamber body 112 and therefore, in fluid communication with the pumping channel 129 formed within the liner 120. The terms "gas" and "gases" are used interchangeably, unless otherwise noted, and refer to one or more precursors, reactants, catalysts, carrier, purge, cleaning, combinations thereof, as well as any other fluid introduced into the chamber body 112.

The lid assembly 140 includes at least two stacked components configured to form a plasma volume or cavity therebetween. In one or more embodiments, the lid assembly 140 includes a first electrode 143 ("upper electrode") disposed vertically above a second electrode 145 ("lower electrode") confining a plasma volume or cavity 150 therebetween. The first electrode 143 is connected to a power source 152, such as an RF power supply, and the second electrode 145 is connected to ground, forming a capacitance between the two electrodes 143, 145.

In one or more embodiments, the lid assembly 140 includes one or more gas inlets 154 (only one is shown) that are at least partially formed within an upper section 156 of the first electrode 143. The one or more process gases enter the lid assembly 140 via the one or more gas inlets 154. The one or more gas inlets 154 are in fluid communication with the plasma cavity 150 at a first end thereof and coupled to one or more upstream gas sources and/or other gas delivery components, such as gas mixers, at a second end thereof.

In one or more embodiments, the first electrode 143 has an expanding section 155 that bounds the plasma cavity 150. In one or more embodiments, the expanding section 155 is an annular member that has an inner surface or diameter 157 that gradually increases from an upper portion 155A thereof to a lower portion 155B thereof. As such, the distance between the first electrode 143 and the second electrode 145 is variable across the expanding section 155. The varying distance helps control the formation and stability of the plasma generated within the plasma cavity 150.

In one or more embodiments, the expanding section 155 resembles an inverted truncated cone or "funnel." In one or more embodiments, the inner surface 157 of the expanding section 155 gradually slopes from the upper portion 155A to the lower portion 155B of the expanding section 155. The slope or angle of the inner diameter 157 can vary depending on process requirements and/or process limitations. The length or height of the expanding section 155 can also vary depending on specific process requirements and/or limitations.

As mentioned above, the expanding section 155 of the first electrode 143 varies the vertical distance between the first electrode 143 and the second electrode 145 because of the gradually increasing inner surface 157 of the first electrode 143. The variable distance is directly influences to the power level within the plasma cavity 150. Not wishing to be bound by theory, the variation in distance between the two electrodes 143, 145 allows the plasma to find the necessary power level to sustain itself within some portion of the plasma cavity 150 if not throughout the entire plasma cavity 150. The plasma within the plasma cavity 150 is therefore less dependent on pressure, allowing the plasma to be generated and sustained within a wider operating window. As such, a more repeatable and reliable plasma can be formed within the lid assembly 140. As the plasma generated in the plasma cavity 150 is defined in the lid assembly 140 prior to entering into a processing region above the support assembly 180 wherein the substrate is proceed, the lid assembly 140 is considered as a remote plasma source because the plasma generated remotely from the processing region.

The expanding section 155 is in fluid communication with the gas inlet 154 as described above. The first end of the one or more gas inlets 154 can open into the plasma cavity 150 at the upper most point of the inner diameter of the expanding section 155. Similarly, the first end of the one or more gas inlets 154 can open into the plasma cavity 150 at any height interval along the inner diameter 157 of the expanding section 155. Although not shown, two gas inlets 154 can be disposed at opposite sides of the expanding section 155 to create a swirling flow pattern or "vortex" flow into the expanding section 155 which helps mix the gases within the plasma cavity 150.

The lid assembly 140 can further include an isolator ring 160 that electrically isolates the first electrode 143 from the second electrode 145. The isolator ring 160 can be made from aluminum oxide or any other insulative, process compatible material. The isolator ring 160 surrounds or substantially surrounds at least the expanding section 155.

The lid assembly 140 can further include a distribution plate 170 and blocker plate 175 adjacent the second electrode 145. The second electrode 145, distribution plate 170 and blocker plate 175 can be stacked and disposed on a lid rim 178 which is connected to the chamber body 112. A hinge assembly (not shown) can be used to couple the lid rim 178 to the chamber body 112. The lid rim 178 can include an embedded channel or passage 179 for circulating a heat transfer medium. The heat transfer medium can be used for heating, cooling, or both, depending on the process requirements.

In one or more embodiments, the second electrode or top plate 145 can include a plurality of gas passages or apertures 165 formed beneath the plasma cavity 150 to allow gas from the plasma cavity 150 to flow therethrough. The distribution plate 170 is substantially disc-shaped and also includes a plurality of apertures 172 or passageways to distribute the flow of gases therethrough. The apertures 172 can be sized and positioned about the distribution plate 170 to provide a controlled and even flow distribution to the processing region of the chamber body 112 where the substrate to be processed is located. Furthermore, the apertures 172 prevent the gas(es) from impinging directly on the substrate surface by slowing and re-directing the velocity profile of the flowing gases, as well as evenly distributing the flow of gas to provide an even distribution of gas across the surface of the substrate.

In one or more embodiments, the distribution plate 170 includes one or more embedded channels or passages 174 for housing a heater or heating fluid to provide temperature control of the lid assembly 140. A resistive heating element (not shown) can be inserted within the passage 174 to heat the distribution plate 170. A thermocouple can be connected to the distribution plate 170 to regulate the temperature thereof. The thermocouple can be used in a feedback loop to control electric current applied to the heating element, as described above.

Alternatively, a heat transfer medium can be passed through the passage 174. The one or more passages 174 can contain a cooling medium, if needed, to better control temperature of the distribution plate 170 depending on the process requirements within the chamber body 112. Any heat suitable transfer medium may be used, such as nitrogen, water, ethylene glycol, or mixtures thereof, for example.

In one or more embodiments, the lid assembly 140 can be heated using one or more heat lamps (not shown). Typically, the heat lamps are arranged about an upper surface of the distribution plate 170 to heat the components of the lid assembly 140 including the distribution plate 170 by radiation.

The blocker plate 175 may optionally be disposed between the second electrode 145 and the distribution plate 170. The blocker plate 175 is removably mounted to a lower surface of the second electrode 145. The blocker plate 175 may be in good thermal and electrical contact with the second electrode 145. In one or more embodiments, the blocker plate 175 can be coupled to the second electrode 145 using a bolt or similar fastener. The blocker plate 175 can also be threaded or screwed onto an outer diameter of the second electrode 145.

The blocker plate 175 includes a plurality of apertures 176 to provide a plurality of gas passages from the second electrode 145 to the distribution plate 170. The apertures 176 can be sized and positioned about the blocker plate 175 to provide a controlled and even flow distribution of gases to the distribution plate 170.

The support assembly 180 may include a support member 185 to support a substrate (not shown in FIG. 1A) for processing within the chamber body 112. The support member 185 may be coupled to a lift mechanism 183 through a shaft 187 which extends through a centrally-located opening 114 formed in a bottom surface of the chamber body 112. The lift mechanism 183 can be flexibly sealed to the chamber body 112 by a bellows 188 that prevents vacuum leakage from around the shaft 187. The lift mechanism 183 allows the support member 185 to be moved vertically within the chamber body 112 between a process position and a lower transfer position. The transfer position is slightly below the slit valve opening 114 formed in a sidewall of the chamber body 112 so that the substrate may be robotically removed from the substrate support member 185.

In one or more embodiments, the support member 185 may have a seal band 195 having an upper surface 190 for contacting a substrate to be processed thereon. The seal band 195 may be a circular band raised from the support member 185. In one embodiment, the upper surface 190 may have micro-roughness texture to form a continuous contact with the substrate being processed.

In one or more embodiments, the substrate (not shown) may be secured to the support member 185 using a vacuum chuck. In one or more embodiments, the substrate (not shown) may be secured to the support member 185 using an electrostatic chuck. An electrostatic chuck typically includes at least a dielectric material that surrounds an electrode 181, which may be located on the support member 185 or formed as an integral part of the support member 185. The dielectric portion of the chuck electrically insulates the chuck electrode 181 from the substrate and from the remainder of the support assembly 180.

In one embodiment, the electrode 181 is coupled to a plurality of RF power bias sources 184, 186. The RF bias power sources 184, 186 provide RF power to the electrode 181 which excites and sustains a plasma discharge formed from the gases disposed in the processing region of the chamber body.

In the embodiment depicted in FIG. 1A, the dual RF bias power sources 184, 186 are coupled to the electrode 181 disposed in the support member 185 through a matching circuit 189. The signal generated by the RF bias power sources 184, 186 is delivered through matching circuit 189 to the support member 185 through a single feed to ionize the gas mixture provided in the plasma process chamber 100, thereby providing ion energy necessary for performing a deposition, etch, or other plasma enhanced process. The RF bias power sources 184, 186 are generally capable of producing an RF signal having a frequency of from about 50 kHz to about 200 MHz and a power between about 0 Watts and about 5000 Watts. Additional bias power sources may be coupled to the electrode 181 to control the characteristics of the plasma as needed.

The support member 185 can include bores 192 formed therethrough to accommodate lift pins 193, one of which is shown in FIG. 1A. Each lift pin 193 is constructed of ceramic or ceramic-containing materials, and are used for substrate-handling and transport. The lift pin 193 is moveable within its respective bore 192 as the support member 185 moves vertically.

The support assembly 180 may further include an edge ring 196 disposed about the support member 185. In one or more embodiments, the edge ring 196 is an annular member that is adapted to cover an outer perimeter of the support member 185 and protect the support member 185 from deposition. The edge ring 196 can be positioned on or adjacent the support member 185 to form an annular purge gas channel between the outer diameter of support member 185 and the inner diameter of the edge ring 196. The annular purge gas channel can be in fluid communication with a purge gas conduit 197 formed through the support member 185 and the shaft 187. The purge gas conduit 197 is in fluid communication with a purge gas supply (not shown) to provide a purge gas to the purge gas channel. Any suitable purge gas such as nitrogen, argon, or helium, may be used alone or in combination. In operation, the purge gas flows through the conduit 197, into the purge gas channel, and about an edge of the substrate disposed on the support member 185. Accordingly, the purge gas working in cooperation with the edge ring 196 prevents deposition at the edge and/or backside of the substrate.

The temperature of the support assembly 180 can be controlled by a fluid circulated through a fluid channel 198 embedded in the body of the support member 185. In one or more embodiments, the fluid channel 198 is in fluid communication with a heat transfer conduit 199 disposed through the shaft 187 of the support assembly 180. The fluid channel 198 is positioned about the support member 185 to provide a uniform heat transfer to the substrate receiving surface of the support member 185. The fluid channel 198 and heat transfer conduit 199 can flow heat transfer fluids to either heat or cool the support member 185 and substrate disposed thereon. Any suitable heat transfer fluid may be used, such as water, nitrogen, ethylene glycol, or mixtures thereof. The support member 185 can further include an embedded thermocouple (not shown) for monitoring the temperature of the support surface of the support member 185, which is indicative of the temperature of the substrate disposed thereon. For example, a signal from the thermocouple may be used in a feedback loop to control the temperature or flow rate of the fluid circulated through the fluid channel 198.

The support member 185 can be moved vertically within the chamber body 112 so that a distance between support member 185 and the lid assembly 140 can be controlled. A sensor (not shown) can provide information concerning the position of support member 185 within chamber 100.

In operation, the support member 185 can be elevated to a close proximity of the lid assembly 140 to control the temperature of the substrate being processed. As such, the substrate may be heated via radiation emitted from the distribution plate 170. Alternatively, the substrate can be lifted off the support member 185 to close proximity of the heated lid assembly 140 using the lift pins 193 activated by the lift ring 195.

A system controller (not shown) may be used to regulate the operations of the process chamber 100. The system controller can operate under the control of a computer program stored on a memory of a computer. The computer program may include instructions that enable the process described below to be performed in the process chamber 100. For example, the computer program can dictate the process sequencing and timing, mixture of gases, chamber pressures, RF power levels, susceptor positioning, slit valve opening and closing, substrate cooling and other parameters of a particular process.

Figure 1B:
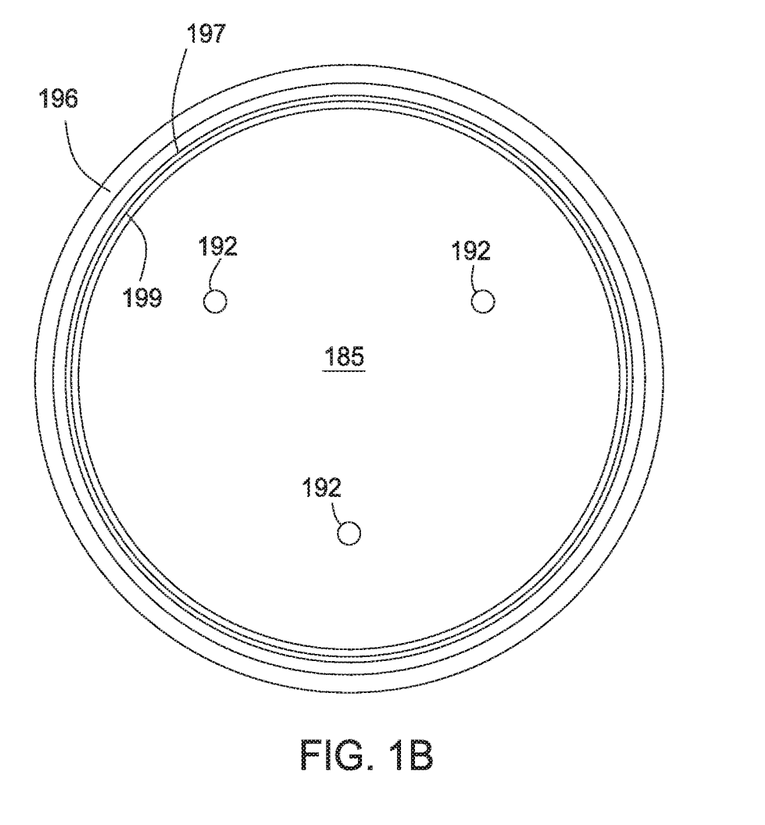
FIG. 1B is a schematic top view of a substrate support in the processing chamber of FIG. 1A.
Figure 1C:
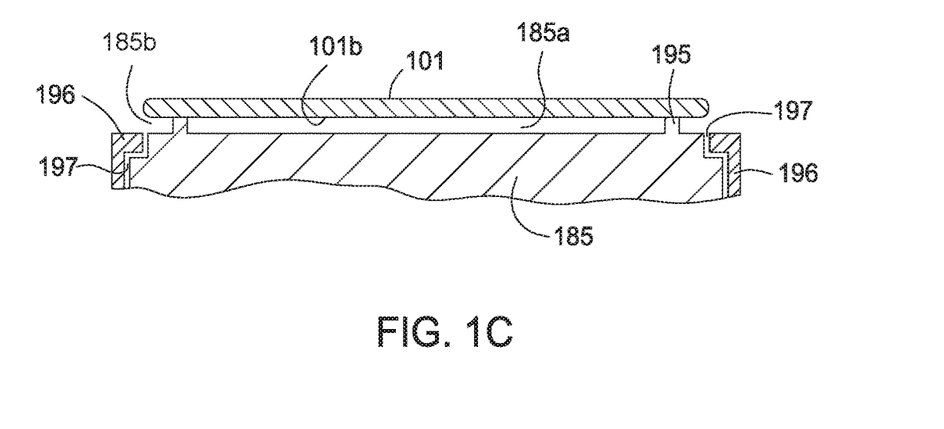
FIG. 1C is a schematic sectional side view of the substrate support in the processing chamber of FIG. 1A.

FIG. 1B is a schematic top view of the support member 185 and the edge ring 196 of the processing chamber of FIG. 1A. FIG. 1C is a partial sectional view of the support member 185 and the edge ring 196 having a substrate 101 disposed thereon. The edge ring 196 covers the edge region of the support member 185 and shields the support member 185 from the processing environment. The edge ring 196 may be regularly replaced. However, when a new edge ring 196 is positioned in the process chamber 100, the presence of the new edge ring 196 affect process rate near the edge region of the substrates. For example, when the process chamber 100 with a new edge ring 196 is used to etch a silicon oxide or silicon nitride, the etch rate near the edge region slowly increases from a low starting rate to a stable saturated rate. In one experiment, the etch rate near the edge region only reaches the stable saturated etch rate after processing nearly 200 substrates with the new edge ring. According to embodiments of the present disclosure, a seasoning film may be formed on a new edge ring 196 in the process chamber 100 by a seasoning process so that the processing rate the edge region of the substrates immediately reaches the stable saturated rate when the new edge ring 196 is disposed in the process chamber 100.

As shown in FIG. 1C, during operation, the substrate 101 is supported by the seal band 195 of the support member 185. The upper surface 197 of the seal band 195 contacts a back side 101b of the substrate 101. The contact between the seal band 195 and the substrate 101 is configured to serve as an isolation fluidly separating an inner volume 185a between the seal band 195 and the support member 185 and an edge volume 185b under the substrate 101 to prevent byproducts in the edge volume 185b from entering the inner volume 185a. During operation, the edge volume 185b may be purged through the purge gas conduit 197. During operation, the seal band 195 also transfers thermal energy between the substrate 101 and the support member 185. For example, the seal band 195 may cool off the substrate 101. Thus the quality of the contact between the seal band 195 and the substrate 101 affects the quality and uniformity of the processing in the process chamber 100. According to embodiments of the present disclosure, a seasoning film may be formed on the upper surface 199 of the seal ring 195 by a seasoning process to improve the quality and uniformity of process.

Figure 2:
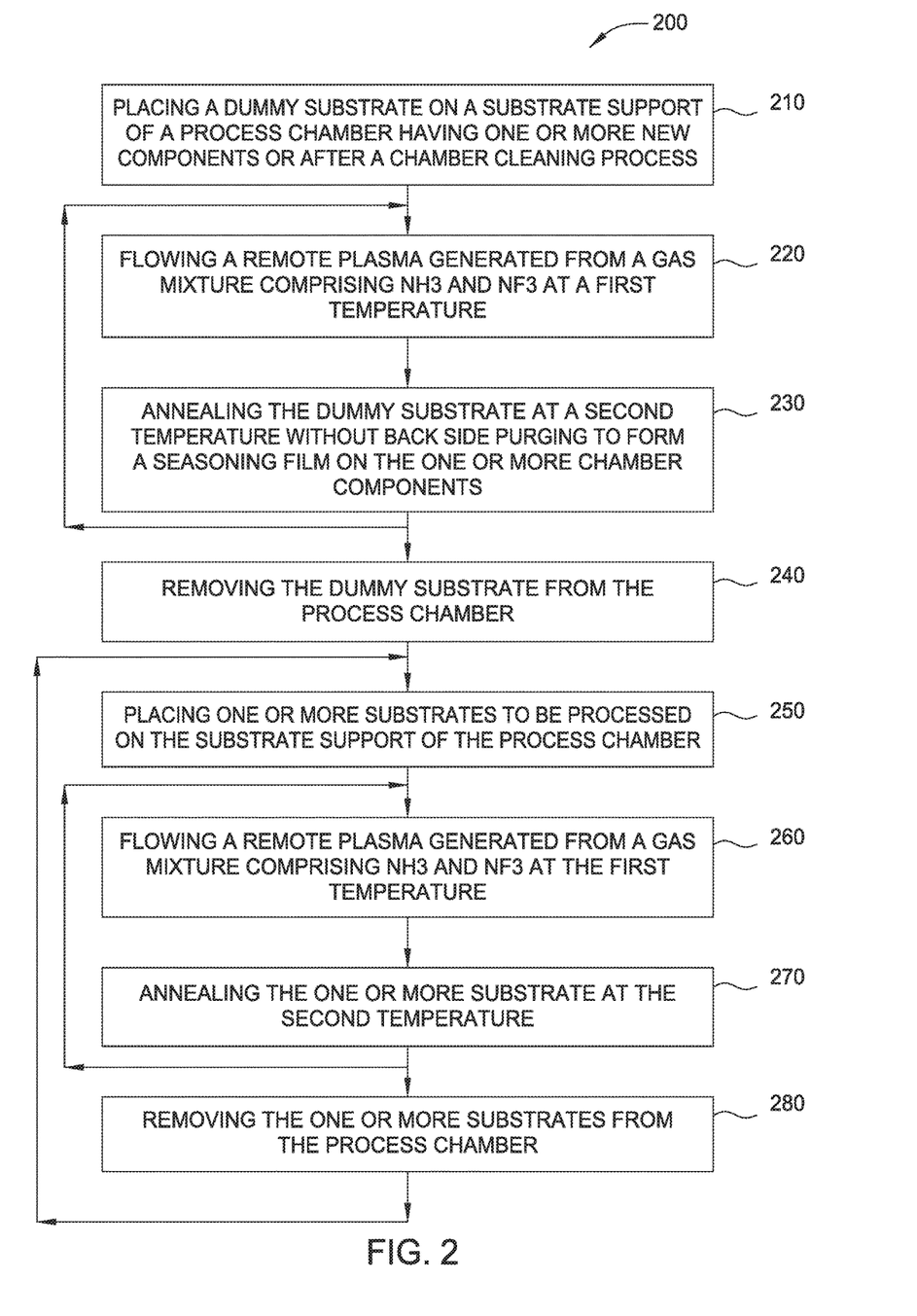
FIG. 2 is a flow chart of a method for seasoning one or more chamber components and processing one or more substrates according to one embodiment of the present disclosure.

FIG. 2 is a flow chart of a method 200 for seasoning one or more chamber components and processing one or more substrates according to one embodiment of the present disclosure. The method 200 may be used to season one or more chamber components in the process chamber 100, such as the edge ring 196 or the seal band 195 on the support member 185. Alternatively, the method 200 may be used the season other permanent or replaceable chamber components, such as the liner 120. Alternatively, the method 200 may be used to perform seasoning and processing in any process chambers where a seasoning film is desirable to achieve process uniformity, process stability, and/or particle performance.

In box 210 of the method 200, a dummy substrate may be disposed on a substrate support of a process chamber for the purpose to season one or more chamber components in the process chamber. In one embodiment, the one or more chamber components may be new components. In another embodiment, the process chamber may be gone through a cleaning process. For example, the process chamber may be the process chamber 100 and the one or more chamber components may be the edge ring 196, the seal bank 195, and/or other chamber components.

In box 220 of the method 200, a plasma may be flown into the process chamber so that the one or more chamber components are exposed to the plasma. In one embodiment, the plasma may be a remote plasma. Alternatively, the plasma may be generated in-situ in the process chamber.

In one embodiment, the dummy substrate may comprises a surface of silicon oxide or silicon nitride and the plasma is a remote plasma generated from an etching gas mixture to react and remove a portion of the silicon oxide or silicon nitride from the dummy substrate. In one embodiment, the etching gas mixture may comprise a mixture of ammonia ($NH_3$) and nitrogen trifluoride ($NF_3$) gases. The amount of each gas introduced into the process chamber may be varied and adjusted to accommodate the chamber structure, such as the geometry of the substrate being cleaned, the volume capacity of the plasma, the volume capacity of the chamber body, as well as the capabilities of the vacuum system coupled to the chamber body.

It is believed that during generation of the remote plasma, ammonia ($NH_3$) gas and the nitrogen trifluoride ($NF_3$) gas are dissociated, forming ammonium fluoride ($NH_4F$) and/or ammonium fluoride with HF ($NH_4F.HF$). Once the etchants of ammonium fluoride ($NH_4F$) and ammonium fluoride with HF ($NH_4F.HF$) are introduced into the processing region of the process chamber, reaching upon the surface of the substrate, the etchants of ammonium fluoride ($NH_4F$) and ammonium fluoride with HF ($NH_4F.HF$) may react with the dielectric materials, such as silicon oxide, forming $(NH_4)_2SiF_6$, mostly in a solid state. The etchants of ammonium fluoride ($NH_4F$) and ammonium fluoride with HF ($NH_4F.HF$) chemically react the material layer 404, forming $(NH_4)_2SiF_6$ in solid state.

In one or more embodiments, the gases added to provide the etching gas mixture having at least a 1:1 molar ratio of ammonia ($NH_3$) to nitrogen trifluoride ($NF_3$). In one or more embodiments, the molar ratio of the etching gas mixture is at least about 3:1 (ammonia to nitrogen trifluoride). The gases are introduced in the chamber 100 at a molar ratio of from about 5:1 (ammonia to nitrogen trifluoride) to about 30:1. In yet another embodiment, the molar ratio of the etching gas mixture is from about 5:1 (ammonia to nitrogen trifluoride) to about 10:1. The molar ratio of the etching gas mixture can also fall between about 10:1 (ammonia to nitrogen trifluoride) and about 20:1.

In one embodiment, other types of gas, such as inert gas or carrier gas, may also be supplied in the etching gas mixture to assist carrying the etching gas mixture into the processing region of the vacuum process chamber 100. Suitable examples of the inert gas or carrier gas include at least one of Ar, He, $N_2$, $O_2$, $N_2O$, $NO_2$, NO, and the like. In one embodiment, the inert or carrier gas may be supplied into the vacuum process chamber 100 is Ar or He at a volumetric flow rate between about 200 sccm and about 1500 sccm.

At box 220, while supplying the etching gas mixture to perform the remote plasma source etching process, a substrate temperature may be maintained at a low range, such as less than about 100 degrees Celsius, such as between about 40 degrees Celsius and about 100 degrees Celsius. It is believed that maintaining the substrate temperature at a low range, such as less than 100 degrees Celsius, may assist increasing the etching rate of the etching process. It is believed that overly high temperature will restrain chemical reaction between ammonia ($NH_3$) and nitrogen trifluoride ($NF_3$) to form the desired etchants, ammonium fluoride ($NH_4F$) and/or ammonium fluoride with HF ($NH_4F.HF$), for etching. As nitrogen trifluoride ($NF_3$) is relatively thermodynamically stable at elevated temperatures, a low temperature utilized during the etching process may favors surface adsorption of plasma of plasma species onto the material being etched. The dummy substrate may be maintained at a temperature range less than about 100 degrees Celsius, such as a temperature between about 30° C. to about 70° C. In one embodiment, the dummy substrate is maintained at a temperature about 50° C.

During the process in box 220, a process pressure in the process chamber 100 is regulated between about 10 mTorr to about 5000 mTorr, such as between about 800 mTorr and about 5 Torr. A RF source power at a frequency of about 80 KHz may be applied to maintain a plasma. For example, a RF source power of about between 20 Watts to about 70 Watts may be applied to the etching gas mixture. In one embodiment, the RF source power may have a frequency of about 80 KHz. Additionally, a RF bias power may be supplied to the electrode 181 to generate a bias power. For example, a RF bias power at a frequency of about 13 or 60 MHz of between about 10 Watts to about 1000 Watts may be applied to the etching gas mixture. The etching gas mixture may be flowed into the chamber at a rate between about 400 sccm to about 2000 sccm.

After the etching gas mixture is supplied into the processing chamber with a low temperature substrate control, such as less than about 100 degrees Celsius, the material layer on the dummy substrate, such as silicon oxide or silicon nitride, may be then etched, forming solid etching byproduct, such as ammonium fluorosilicate $(NH_4)_2SiF_6$, on the substrate surface. The etching byproduct $(NH_4)_2SiF_6$, remaining on the substrate has a relatively low melting point, such as about 100 degrees Celsius, which may be removed from the substrate by a sublimation process, which will be further discussed below at box 230. The etching process may be performed for between about 60 seconds and about 2000 seconds. In one embodiment, the etching process of in box 220 may be performed between about 10 to 20 seconds to about 2 to 3 minutes.

In box 230 of the method 200, a low temperature anneal may be performed to the dummy substrate. In one embodiment, at least a portion of the process chamber is not purged to enable formation of a seasoning film on the one or more chamber components. In one embodiment, the low temperature anneal is performed without back side chamber purging to form a seasoning film on the one or more chamber components. For example, in the process chamber 100, the gas purge conduit 197 is closed to allow a seasoning film to form on the edge ring 196 and/or the upper surface 199 of the seal bank 197.

As the etching byproduct, such as ammonium fluorosilicate $(NH_4)_2SiF_6$, is formed on the dummy substrate in box 220, a low temperature plasma anneal process is performed to sublimate the ending byproduct in a volatile state without completely pumping out the process chamber, thus allowing the sublimated byproduct to adhesive to surfaces of the one or more chamber components and forming a seasoning film thereon. During the low temperature anneal in box 230, the substrate temperature is maintained low, such as a low temperature range less than about 100 degrees Celsius.

In one embodiment, the low temperature plasma anneal process is performed by supplying a plasma anneal gas mixture into the process chamber. A plasma is then formed from the plasma anneal gas mixture to plasma anneal the substrate, forming volatile gas byproducts.

In one embodiment, the plasma anneal gas mixture includes at least one of a hydrogen containing gas, a nitrogen containing gas, or an inert gas. It is believed that the hydrogen containing gas, the nitrogen containing gas, or inert gas supplied in the plasma anneal gas mixture may assist increasing the lifetime of the ions in the plasma formed from the plasma anneal gas mixture, thereby efficiently sublimating the etching byproducts from the dummy substrate.

In one embodiment, the hydrogen containing gas supplied into the process chamber includes at least one of $H_2$, $H_2O$, and the like. The nitrogen containing gas supplied into the process chamber 100 includes at $N_2$, $N_2O$, $NO_2$, $NH_3$ and the like. The inert gas supplied into the process chamber 100 includes at least one of Ar, He, Kr, and the like. In an exemplary embodiment, the hydrogen containing gas supplied in the process chamber to perform the treatment process is $H_2$ gas, and the nitrogen containing gas supplied in the process chamber to perform the treatment process is $N_2$ gas and the inert gas is He or Ar.

During the plasma anneal process in box 230, several process parameters may be regulated to control the pretreatment process. In one exemplary embodiment, a process pressure in the process chamber is regulated between about 10 mTorr to about 5000 mTorr, such as between about 10 mTorr and about 200 mTorr. A RF bias power at a frequency of about 13 MHz may be applied to maintain a plasma in the treatment gas mixture. For example, a RF bias power of about 20 Watts to about 300 Watts may be applied to maintain a plasma inside the process chamber. The plasma anneal gas mixture may be flowed into the chamber at a rate between about 100 sccm to about 1000 sccm. A substrate temperature is maintained less than 100 degrees Celsius, for example between about room temperature to about 100 degrees Celsius, such as between about 40 degrees Celsius and about 100 degrees Celsius.

In one embodiment, the temperature of the dummy substrate may be increased from the first and lower temperature in box 220 to the second and higher temperature in box 230 by moving the dummy substrate closer to the chamber lid, such as the chamber lid 140, which is heated by generation of plasma.

In one embodiment, the anneal process in box 230 may be performed between about 5 seconds to about 5 minutes. In one embodiment, the anneal process in box 230 may be performed for about 2 minutes. In another embodiment, the anneal process in box 230 may be performed between about 5 seconds to 10 seconds.

In one embodiment, the processes in box 220 and box 230 may be repeated in a cyclic manner until a seasoning film of a desirable quality if formed. For example, the processes in box 220 and box 230 may be performed for about three cycles. Alternatively, the processes in box 220 and box 230 may be performed until residual tests shown a seasoning film of desirable properties has been formed. For example, the dummy substrate may be removed from the process chamber, and the particles on the back side of the dummy substrate are counted. When the number of the back side particles is below a critical value, a desirable seasoning film is formed on the seal band, such as the seal band 195 on the support member 185 of the process chamber 100.

In box 240 of the method 200, the dummy substrate is removed from the process chamber so that the process chamber can be used to process substrates.

In one embodiment, the seasoning process in box 220 and box 230 may be identical to the process to be performed in the process chamber. Therefore, the seasoning process in box 220 and box 230 may be replaced with other processes when the process chamber is configured to perform other processes.

In box 250 of the method 200, one or more substrates to be processed on the substrate support of the process chamber after the seasoning film are formed on one or more components of the process chamber. In one embodiment, the process chamber may be used to perform an etch process, such as a selective etch process, on the one or more chambers.

In box 260 of the method 200, an etch process that converts material to be etched to sublimatable byproduct may be performed. In one embodiment, the process in box 260 may be substantially similar to the process in box 220. Alternatively, the process in box 260 may be adjusted or modified from the process in box 220.

In box 270 of the method 200, a low temperature anneal may be performed on the substrate to sublimate and remove the etch byproduct from the process chamber by pumping out the process chamber. In one embodiment, the process in box 270 may be substantially similar to the process in box 230 except chamber purging is fully performed in the process of box 270.

The process in box 260 and the process in box 270 may be performed in cyclic manner until a desirable amount of material has been removed from the one or more substrates.

It should be noted that other processes that may be beneficial from a seasoning film of the present disclosure may performed in place of the process in box 260 and box 270.

In box 280 of the method 200, after the process on the one or more substrates is complete, the one or more substrates may be removed from the process chamber and the process chamber is ready to process new substrates to be processed.

The processes in box 250 to box 280 may be repeated until a cleaning process in desired. In one embodiment, the processes in box 250 to box 280 may be performed as many as 750 times with satisfactory results without performing a chamber cleaning process.

Figure 3A:
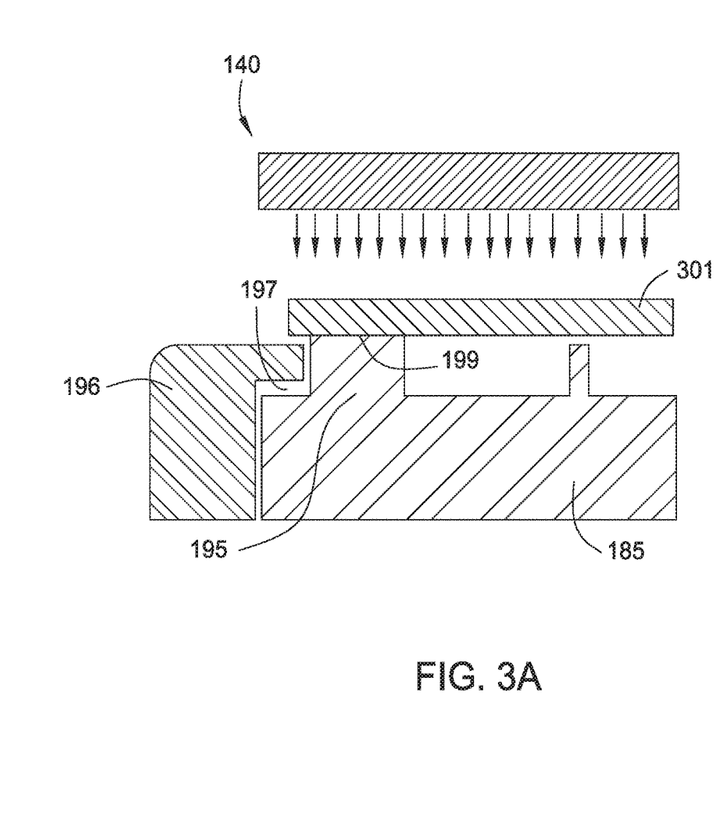
FIGS. 3A and 3B are schematic partial sectional view of a processing chamber showing seasoning of an edge ring in the processing chamber.
Figure 3B:
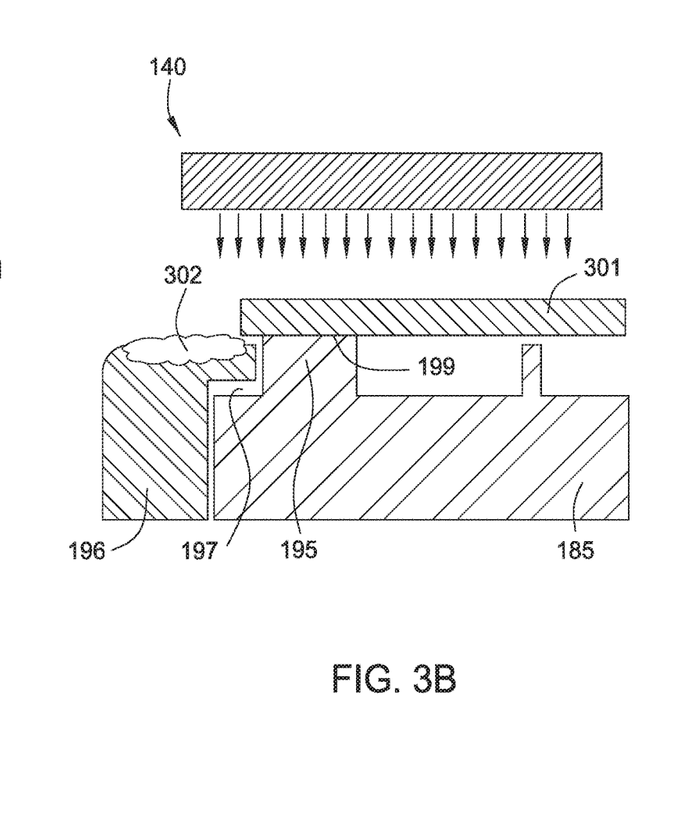

FIGS. 3A and 3B are schematic partial sectional view of the process chamber 100 showing seasoning process of the edge ring 196. FIG. 3A is a schematic partial sectional view of the edge ring 196 prior to seasoning. A dummy substrate 301 is placed on the support member 185. FIG. 3B is a schematic partial sectional view of the edge ring 196 having a seasoning film 302 formed thereon. In one embodiment, the seasoning film 302 may be formed according to the method 200. For example, the seasoning film 302 may be formed according to the seasoning process in box 210, 220, and 230 of the method 200. The seasoning film 302 assures an immediate saturate process rate, such as etch rate, near the edge region of the substrate when the edge ring 196 is new or after the process chamber has been cleaned.

Figure 4A:
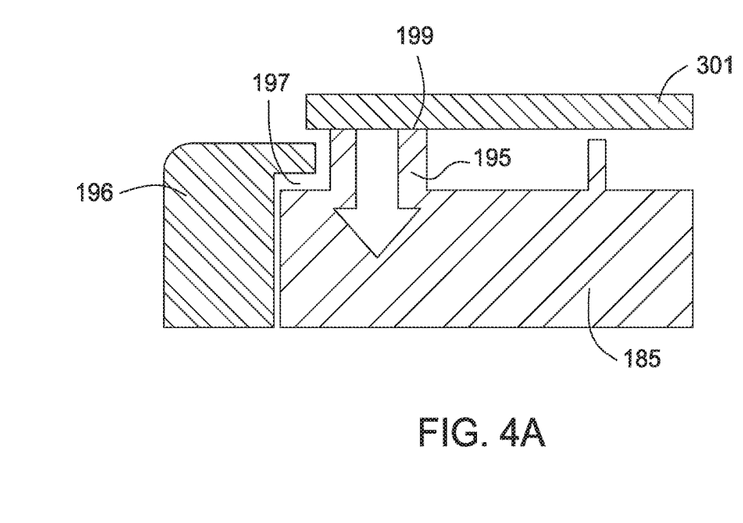
FIGS. 4A and 4B are schematic partial sectional view of a processing chamber showing seasoning of a substrate support.
Figure 4B:
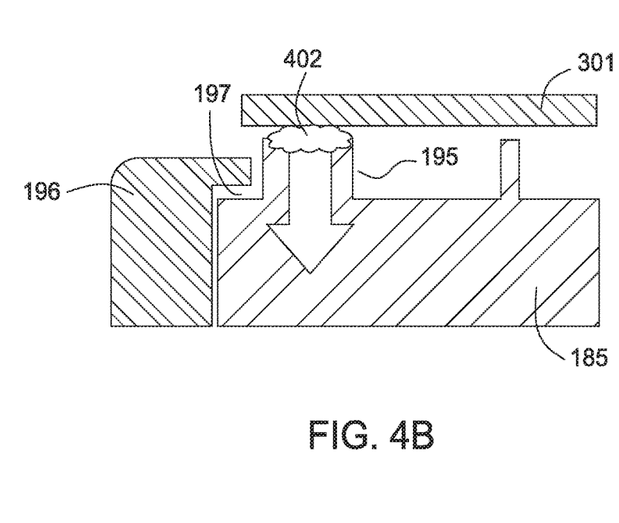

FIGS. 4A and 4B are schematic partial sectional view of the process chamber 100 showing seasoning of the substrate support 185. FIG. 4A is a schematic partial sectional view of the seal band 195 prior to seasoning. FIG. 4B is a schematic partial sectional view of the seal band 195 having a seasoning film 402 formed thereon. In one embodiment, the seasoning film 402 may be formed according to the method 200. For example, the seasoning film 402 may be formed according to the seasoning process in box 210, 220, and 230 of the method 200.

Figure 4C:
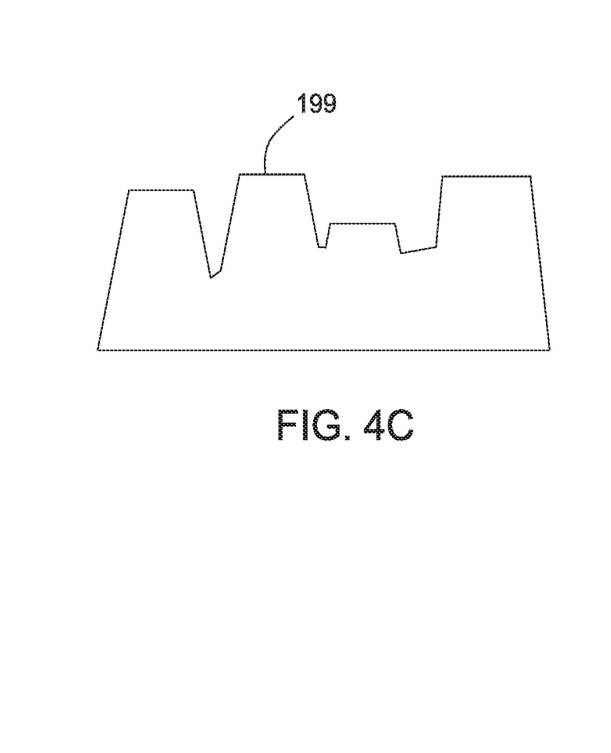
FIGS. 4C and 4D are schematic enlarged sectional view of a substrate contact surface before and after a seasoning process according to one embodiment of the present disclosure.
Figure 4D:
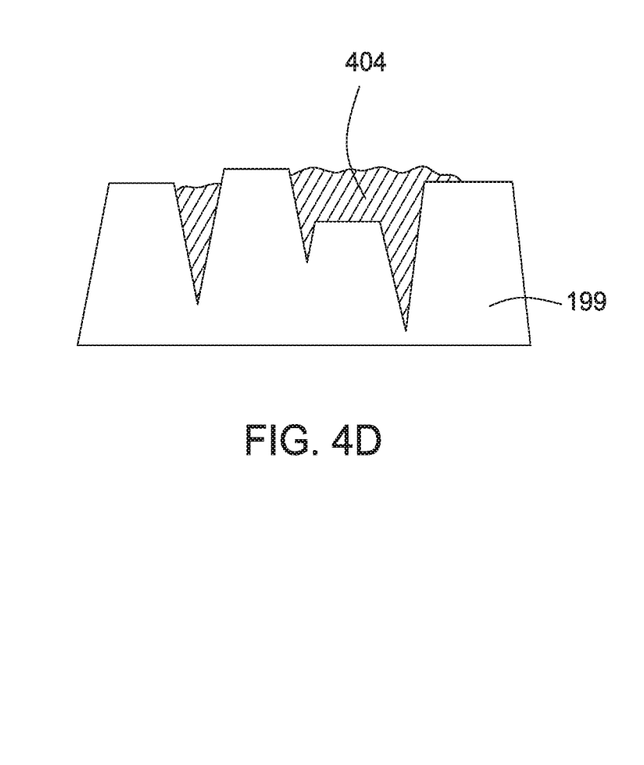

FIGS. 4C and 4D are schematic enlarged sectional views of the upper surface 199 of the seal band 195 before and after a seasoning process according to one embodiment of the present disclosure. As shown in FIG. 4C, the upper surface 199 has a surface roughness which reduces the contact areas between the substrate and the seal band 195 during processing. The seasoning film 402 fills the roughness of the upper surface 199 of the seal band 195 thus increases contact areas between the substrate and the seal band 195.

The seasoning film 402 improves thermal conductivity between the substrate and the seal band 195. The seasoning film 402 also improves the fluidic isolation between opposite sides of the seal band 195 thus improving particle performance. The seasoning film 402 on the seal band 195 improves process uniformity over the entire substrate. The seasoning film 402 may be formed on the seal band 195 when the seal band 195 is new or after the process chamber 100 has been cleaned.

Figure 5A:
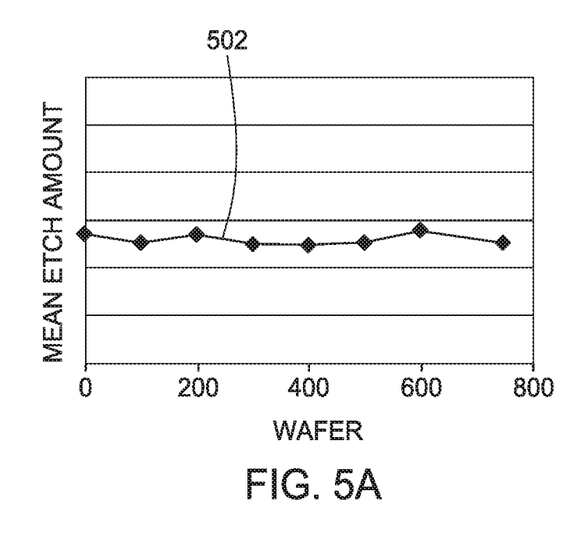
FIG. 5A is a plot showing mean etch amount on a plurality of wafers processed using a method according to the present disclosure.

FIG. 5A is a plot showing mean etch amount on a plurality of substrates processed using the method 200 of the present disclosure. Curve 502 illustrates normalized mean etch amount on 750 substrates continuously processed in the process chamber after one seasoning process according to embodiment of the present disclosure. The mean etch amount is obtained by measuring 49 points in each substrate processed. Curve 502 shows that the process chamber remains high process stability for at least 750 substrates after a seasoning process.

Figure 5B:
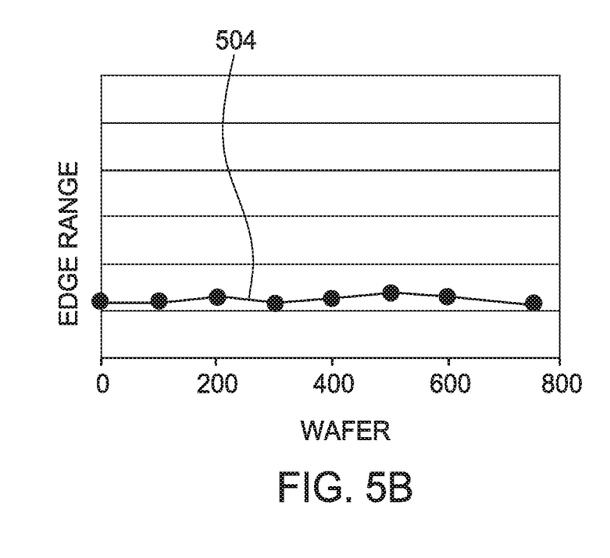
FIG. 5B is a plot showing etch amount on edges of a plurality of wafers processed using a method according to the present disclosure.

FIG. 5B is a plot showing etch amount on edges of a plurality of substrates processed using the method 200 of the present disclosure. Curve 504 illustrates normalized edge etch range on 750 substrates continuously processed in the process chamber after one seasoning process according to embodiment of the present disclosure. The edge etch range is obtained by measuring 25 points on an edge region of each substrate processed. Curve 504 shows that the process chamber remains high process uniformity for at least 750 substrates after a seasoning process.

While the foregoing is directed to implementations of the present disclosure, other and further implementations of the disclosure may be devised without departing from the basic scope thereof, and the scope thereof is determined by the claims that follow.

The invention claimed is:

1. A method for seasoning one or more chamber components in a process chamber, comprising:
    placing a dummy substrate in the process chamber;
    flowing a processing gas mixture to the process chamber to react with the dummy substrate and generate a byproduct on the dummy substrate; and
    annealing the dummy substrate to sublimate the byproduct while at least one purge conduit of the process chamber is closed.

2. The method of claim 1, wherein the at least one purge conduit faces a backside of the dummy substrate.

3. The method of claim 2, wherein flowing a processing gas mixture comprises flowing a remote plasma of the processing gas mixture.

4. The method of claim 3, wherein the processing gas mixture comprises ammonia ($NH_3$) and nitrogen trifluoride ($NF_3$).

5. The method of claim 4, wherein the byproduct comprises ammonium fluorosilicate ($(NH_4)_2SiF_6$).

6. The method of claim 2, wherein annealing the dummy substrate further comprises flowing a hydrogen containing annealing gas.

7. The method of claim 1, wherein the one or more chamber components comprises an edge ring.

8. The method of claim 1, wherein the one or more chamber components comprises a seal band extending from a substrate support to contact a backside of the dummy substrate.

9. The method of claim 3, wherein an upper surface of the dummy substrate comprises silicon oxide or silicon nitride.

10. The method of claim 1, further comprising repeating the flowing and the annealing in a cyclic manner.

11. A method for processing one or more substrates a process chamber, comprising:
    placing a dummy substrate in the process chamber;
    flowing a processing gas mixture to the process chamber to react with the dummy substrate and generate a byproduct on the dummy substrate; and
    annealing the dummy substrate to sublimate the byproduct while at least one purge conduit of the process chamber is closed;
    removing the dummy substrate;
    placing a substrate to be processed in the process chamber;
    flowing the processing gas mixture to the process chamber to react with the substrate and generate the byproduct on the substrate; and
    annealing the substrate to sublimate the byproduct from the substrate while purging through the at least one purge conduit of the process chamber.

12. The method of claim 11, wherein the at least one purge conduit faces the backside of the dummy substrate.

13. The method of claim 12, wherein flowing a processing gas mixture comprises flowing a remote plasma of the processing gas mixture.

14. The method of claim 13, wherein the processing gas mixture comprises ammonia ($NH_3$) and nitrogen trifluoride ($NF_3$).

15. The method of claim 14, wherein the byproduct comprises ammonium fluorosilicate ($(NH_4)_2SiF_6$).

16. The method of claim 12, wherein the annealing further comprises flowing a hydrogen containing annealing gas.

17. The method of claim 11, wherein an upper surface of the dummy substrate or the substrate comprises silicon oxide or silicon nitride.

18. The method of claim 11, wherein the one or more chamber components comprises an edge ring or a seal band on a substrate support.

* * * * *